(12) United States Patent
Knollenberg et al.

(10) Patent No.: US 8,581,263 B2
(45) Date of Patent: Nov. 12, 2013

(54) LASER-INDUCED FLAW FORMATION IN NITRIDE SEMICONDUCTORS

(75) Inventors: Clifford F. Knollenberg, Fremont, CA (US); William S. Wong, San Carlos, CA (US); Christopher L. Chua, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 615 days.

(21) Appl. No.: 12/337,561

(22) Filed: Dec. 17, 2008

(65) Prior Publication Data

US 2010/0148188 A1   Jun. 17, 2010

(51) Int. Cl.
*H01L 29/72* (2006.01)
(52) U.S. Cl.
USPC 257/79; 257/622; 257/E21.599; 257/E33.001; 257/E29.166; 438/33; 438/463
(58) Field of Classification Search
USPC ............ 257/79, 622, E21.599, E33.001, 257/E29.166; 438/33, 463
See application file for complete search history.

(56) References Cited

U.S. PATENT DOCUMENTS

| 6,617,261 | B2 | 9/2003 | Wong et al. | |
| 2007/0298587 | A1* | 12/2007 | Park et al. | 438/458 |
| 2010/0099237 | A1* | 4/2010 | Gadkaree | 438/458 |

OTHER PUBLICATIONS

M.K. Kelley, et al., Optical Patterning of GaN Films, Appl. Phys. Lett. 69 (12), Sep. 16, 1996, American Institute of Physics, pp. 1749-1751.

\* cited by examiner

*Primary Examiner* — Edward Wojciechowicz
(74) *Attorney, Agent, or Firm* — Blakely Sokoloff Taylor & Zafman LLP

(57) ABSTRACT

An embodiment is a method and apparatus to induce flaw formation in nitride semiconductors. Regions of a thin film structure are selectively decomposed within a thin film layer at an interface with a substrate to form flaws in a pre-determined pattern within the thin film structure. The flaws locally concentrate stress in the pre-determined pattern during a stress-inducing operation. The stress-inducing operation is performed. The stress-inducing operation causes the thin film layer to fracture at the pre-determined pattern.

13 Claims, 6 Drawing Sheets

LASER-INDUCED FLAW FORMATION IN NITRIDE SEMICONDUCTORS

TECHNICAL FIELD

The presently disclosed embodiments are directed to the field of semiconductors, and more specifically, to flaw formation in semiconductors.

BACKGROUND

GaN-based light-emitting diodes (LEDs) have been popular recently. Sapphire is the most commonly used substrate in the epitaxy growth of LED devices, but limits the devices performance due to its poor electrical and thermal conductivity. Ultraviolet (UV) laser lift-off (LLO) technology has been developed for transferring GaN LED thin films from a sapphire substrate to a Si or Cu substrate without degrading the crystal quality. Two common issues with LLO procedures are incomplete decomposition at the chip edges and partitioning the diced chip into smaller regions.

Chips, notches, polishing imperfections, and the optical effects at the sapphire boundaries may cause incomplete decomposition locally within the LLO layer. Upon separation of the substrate and film, this may cause film damage, especially cracking.

Patterning the LLO region into portions smaller than the diced piece may often be desired. The typical method for doing this is by patterning and etching through the LED to the sapphire substrate to partition the intended LLO regions prior to dicing. Many techniques use a wet or plasma etching process employing a photolithography step to partition LLO regions.

SUMMARY

One disclosed feature of the embodiments is a method and apparatus to induce flaw formation in nitride semiconductors. Regions of a thin film structure are selectively decomposed within a thin film layer to form flaws in a pre-determined pattern within the thin film structure. The flaws locally concentrate stress in the pre-determined pattern during a stress-inducing operation. The stress-inducing operation is performed. The stress-inducing operation causes the thin film layer to fracture at the pre-determined pattern.

One disclosed feature of the embodiments is an apparatus having flaws in nitride semiconductors. A thin film layer of a thin film structure has flaws formed in a pre-determined pattern. The flaws locally concentrate stress in the pre-determined pattern during a stress-inducing operation. A substrate attached to the thin film layer is removed in the stress-inducing operation.

BRIEF DESCRIPTION OF THE DRAWINGS

Embodiments may best be understood by referring to the following description and accompanying drawings that are used to illustrate various embodiments. In the drawings.

DETAILED DESCRIPTION

Figure 1:
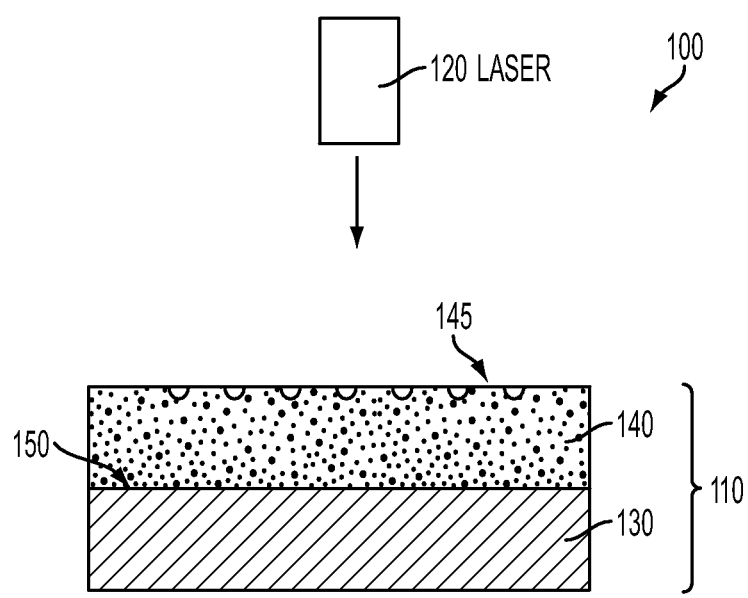
FIG. 1 is a diagram illustrating a system using laser to irradiate from top surface of the thin film structure according to one embodiment.

One disclosed feature of the embodiments is a technique to induce flaw formation in nitride semiconductors. Regions of a thin film structure are selectively decomposed within a thin film layer to form flaws in a pre-determined pattern within the thin film structure. The flaws locally concentrate stress in the pre-determined pattern during a stress-inducing operation. The stress-inducing operation is performed. The stress-inducing operation causes the thin film layer to fracture at the pre-determined pattern. The stress-inducing operation is ideally a LLO procedure which in addition to separating the thin film layer from the substrate, causes the thin film layer to fracture at the pre-determined pattern. A thin film may be any layer or a number of layers bonded together whose total thickness is less than 50 microns. In one embodiment, the thin film structure is one of a LED structure, a transistor structure, and a laser structure, or device; and the thin film layer is an epitaxially grown LED, transistor, or laser layer.

One disclosed feature of the embodiments is an apparatus having flaws in nitride semiconductors. A thin film layer of a thin film structure has flaws formed in a pre-determined pattern. In one embodiment, the flaws extend from top surface toward interface between the thin film layer and the substrate. In another embodiment, the flaws extend from interface between the thin film layer and the substrate into the thin film layer. The flaws locally concentrate stress in the pre-determined pattern during a stress-inducing operation. A substrate attached to thin film layer is removed in the stress-inducing operation. The stress-inducing operation may be a LLO procedure which results in fracture at the pre-determined pattern as well as separation of the substrate and the thin film layer.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a method and apparatus to form flaws and/or partitions in a nitride semiconductor. A focused laser is used to decompose small regions of the epi-structure of a thin film layer. The small regions may correspond to flaws, notches, voids, or trenches that cause the thin film layer to fracture during a stress-inducing operation along a pre-determined pattern or path. These fractures may be used to partition the thin film layer into different regions and prevent the fractures or cracks originating from regions with incomplete decomposition from propagating.

The focused laser has a high intensity beam with a small spot size to decompose narrow lines within the thin film layer adjacent to the diced edges, prior to the stress-inducing operation. The use of a focused laser with a small spot size and high energy density permits a greater penetration and decomposition depth within the target material. The technique may also be used in the interior of the diced chip to form LLO regions of an arbitrary pre-determined shape or pattern. The technique may be used with AlGaN, AlInGaN, InGaN, and GaN alloys.

The focused laser may provide a focused spot in an approximately 10×20 μm oval that may decompose material to a depth of approximately 0.2 to 1.2 μm. The average depth is approximately 0.4 μm. The laser equipment may have control software or hardware or a combination of software and hardware to allow stitching individual spots together with a fixed spacing to form pre-determined lines and patterns. The patterns may be repeated any number of times to increase the penetration depth to a desired depth.

The technique offers a number of advantages over prior art techniques. First, it offers an alternative method for partitioning LLO regions. Second, it allows formation of arbitrary patterns with substantial penetration into the semiconductor. Third, when the flaw forms a trench, the technique prevents stress transfer during substrate and film separation. This stress propagates from improperly decomposed regions near diced edges into the center of the film and may cause cracks or film damage in the active region of the thin film structure. Fourth, when the flaw forms an internal flaw such as void formation, the technique concentrates stresses causing the film to fracture along a predictable or pre-determined pattern or path. Fifth, it permits partitioning of the LLO region after flip-chip bonding to a heat sink or package without requiring etching before flip-chip bonding, resulting in process flexibility. Sixth, it does not require a photolithography phase because it is a direct write technique using laser.

FIG. 1 is a diagram illustrating a system 100 using laser to irradiate from top surface of the thin film structure according to one embodiment. The system 100 includes a thin film structure 110 and a laser 120. The system 100 may include more components than the above components.

The thin film structure 110 includes a thin film layer 140 and a substrate 130. The thin film structure 110 may include other components or layers. Often, the thin film layer 140 may include one or more sublayers of varying composition and performing different functions within the desired thin film device.

The thin film layer 140 may include one or more semiconductor materials with a band gap corresponding to an energy level less than the wavelength of the laser causing it to absorb the laser energy. The absorption of the laser energy causes a localized temperature increase sufficient to break the chemical bonds of the semiconductor materials and decompose them into their constituent elements. The thin film layer 140 may be an alloy containing nitrogen (N). The alloy may be one of Gallium Nitride (GaN), Aluminum Gallium Nitride (AlGaN), Indium Gallium Nitride (InGaN), and Aluminum Indium Gallium Nitride (AlInGaN). The thin film layer 140 and the substrate 130 are bonded at the interface surface 150.

The substrate 130 may be any suitable substrate transparent to the wavelength (e.g., 266 nm) of the laser light, and may include a template or intermediate layer grown separately from the thin film layer. This intermediate layer may or may not be absorbing to the laser light. If it absorbs the laser light, it may be treated as part of the thin film layer 140. If it does not absorb the light, it may be treated as part of the substrate 130. This intermediate or template layer may be an alloy being one of Gallium Nitride (GaN), Aluminum Gallium Nitride (AlGaN), Aluminum Nitride (AlN), Indium Gallium Nitride (InGaN), or Aluminum Indium Gallium Nitride (AlInGaN). In one embodiment, the substrate 130 is a sapphire substrate. It may be removed by a subsequent LLO operation. The subsequent LLO operation is a separate process and may employ the same or different laser.

The laser 120 may be any suitable highly focused laser. In one embodiment, it is a frequency quadrupled Nd-YAG laser at 266 nm. It irradiates the thin film structure to create flaws, trenches, or voids on the surface 145 of the thin film layer 140 in a pre-determined pattern. The laser 120 may irradiate by regular spacing of individual pulses following the pre-determined pattern. The irradiation starts from the top surface 145 of the thin film layer 140 and toward the interface 150 with the substrate 130. The entire thin film layer 140 or the substrate 130 is not decomposed, but only specific layers within the thin film structure 110 are decomposed to form flaws. The flaws (e.g., notches or voids) formed on the surface 145 include a number of small spots that form the pre-determined pattern. The flaws locally concentrate the stress in this pre-determined pattern during a stress-inducing operation such as the subsequent LLO operation.

The laser 120 may have a control circuit or software to stitch the spots in forming the pre-determined pattern. In addition, the irradiation may be repeated as many times as necessary to achieve the desired penetration depth on the irradiation surface 135.

Figure 2:
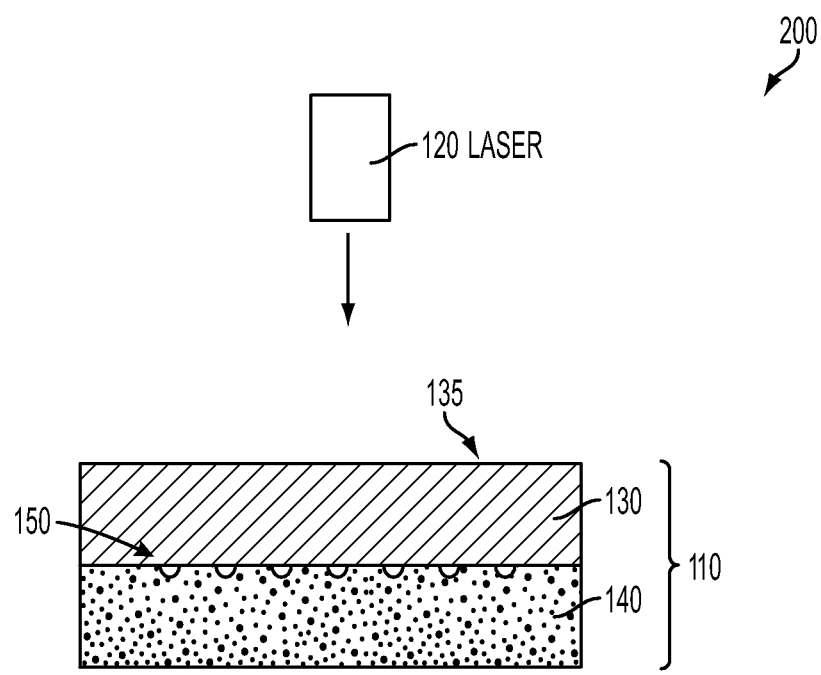
FIG. 2 is a diagram illustrating a system using laser to irradiate from backside of the LED structure according to one embodiment.

FIG. 2 is a diagram illustrating a system 200 using laser to irradiate from backside of the thin film structure according to one embodiment. The system 200 includes the same components as in FIG. 1 except that the irradiation is from the backside of the thin film structure 110.

The laser 120 irradiates the backside of the thin film layer 140 through the substrate 130. The substrate 130 may be polished before irradiation. The irradiation goes through the substrate 130 toward the interface surface 150 between the substrate 130 and the thin film layer 140 where it is absorbed in the thin film layer 140. The decomposition is initiated within the thin film layer at a layer with a suitable band gap for absorption. The irradiation creates or forms flaws (e.g., notches or voids) starting at the interface 150, and extending into the thin film layer 140. The flaws extend from the interface 150 between the thin film layer 140 and the substrate 130 into the thin film layer 140. As in the embodiment shown in FIG. 1, these flaws locally concentrate the stress in this pre-determined pattern during a stress-inducing operation such as the subsequent LLO operation.

Also, as in the system 100, the laser 120 may have a control circuit or software to stitch the spots in forming the pre-determined pattern. In addition, the irradiation may be repeated as many times as necessary to achieve the desired penetration depth on the irradiation surface 145.

Figure 3:
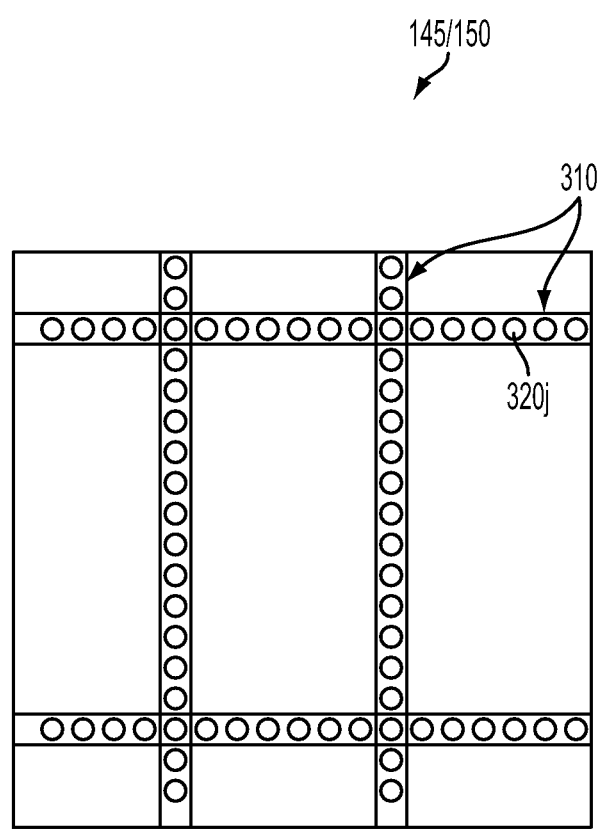
FIG. 3 is a diagram illustrating irradiation surface of the thin film structure according to one embodiment.

FIG. 3 is a diagram illustrating irradiation surface 145/150 of the thin film structure according to one embodiment. The irradiation surface 145/150 includes a pattern 310 and a number of spots $320_j$'s (j=1, ..., N).

The pattern 310 may be a pre-determined pattern that has any arbitrary shape or paths. It may include vertical and/or horizontal lines. It may include any pattern that may cause fracture during the subsequent stress-inducing operation. In one embodiment, it is near the diced edges of the thin film structure 110 (FIG. 1). The pattern 310 may form regions that are smaller than the diced pieces of the thin film structure 110. This may be useful for partitioning the LLO region prior to dicing.

The focused spots $320_j$'s form the flaws, trenches, notches or voids on the surface 135/145. They may include small spots. They may have a round or oval shape as created by laser irradiation. The dimensions of the focused spots $320_j$'s may be any suitable dimensions. They may range from a few microns to less than a hundred microns. In one embodiment, the focused spot $320_j$ may have dimensions of approximately 10×20 μm. It may have a depth of approximately 0.2 μm to 1.2 μm. The average depth size of the focused spots $320_j$'s may range from approximately 0.3 μm to 0.8 μm. In one embodiment, the average depth size is 0.4 μm.

The focused spots $320_j$'s (j=1, . . . , N) may be stitched or joined together to form a continuous line, curve, or pattern according to the pattern 310.

Figure 4:
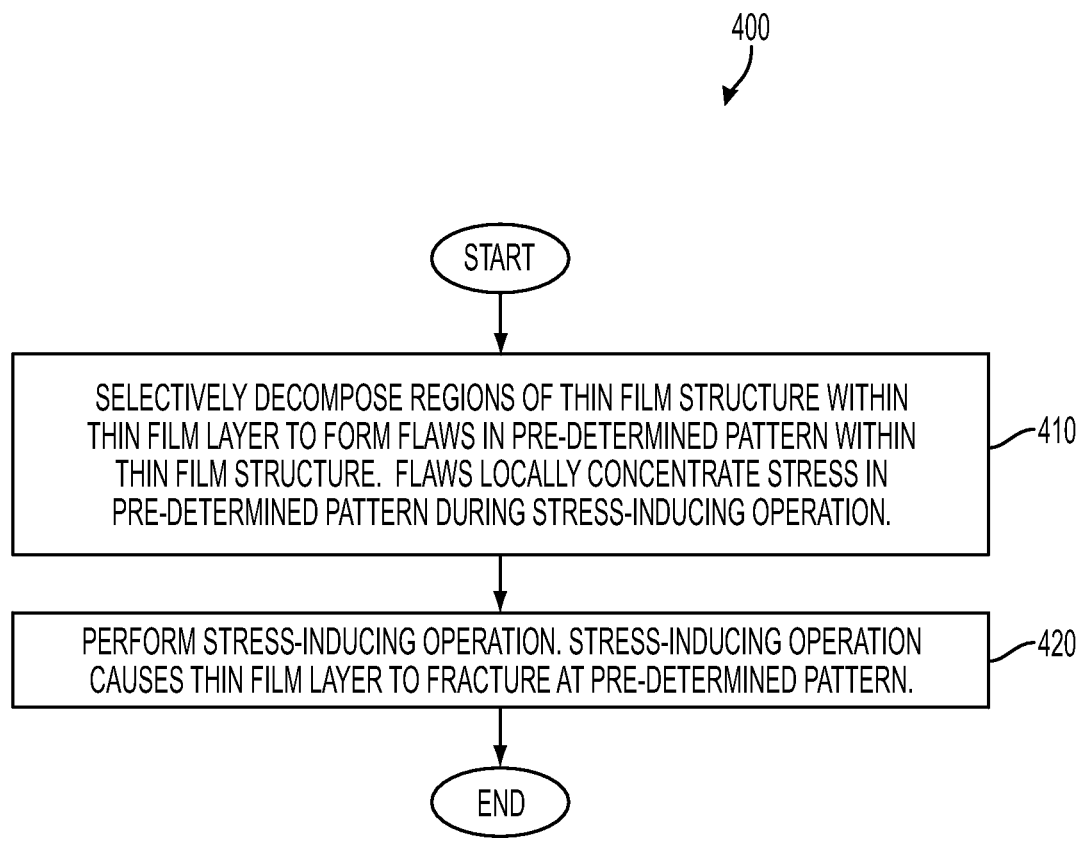
FIG. 4 is a flowchart illustrating a process to form flaws in nitride semiconductors according to one embodiment.

FIG. 4 is a flowchart illustrating a process 400 to form flaws in nitride semiconductors according to one embodiment.

Upon START, the process 400 selectively decomposes regions of a thin film structure within a thin film layer at an interface with a substrate to form flaws in a pre-determined pattern within the thin film structure (Block 410). In one embodiment, the thin film structure is one of a LED structure, a transistor structure, and a laser structure, or device; and the thin film layer is an epitaxially grown LED, transistor, or laser layer. In one embodiment, the substrate is a sapphire substrate. The flaws locally concentrate stress in the pre-determined pattern during a stress-inducing operation. In one embodiment, the decomposed regions are near the diced edges of the thin film structure. At least one of the flaws is a trench or a void formation. Next, the process 400 performs the stress-inducing operation. The stress-inducing operation causes the thin film layer to fracture at the pre-determined pattern (Block 420). In one embodiment, the stress-inducing operation may be a LLO operation. The process 400 is then terminated.

Figure 5:
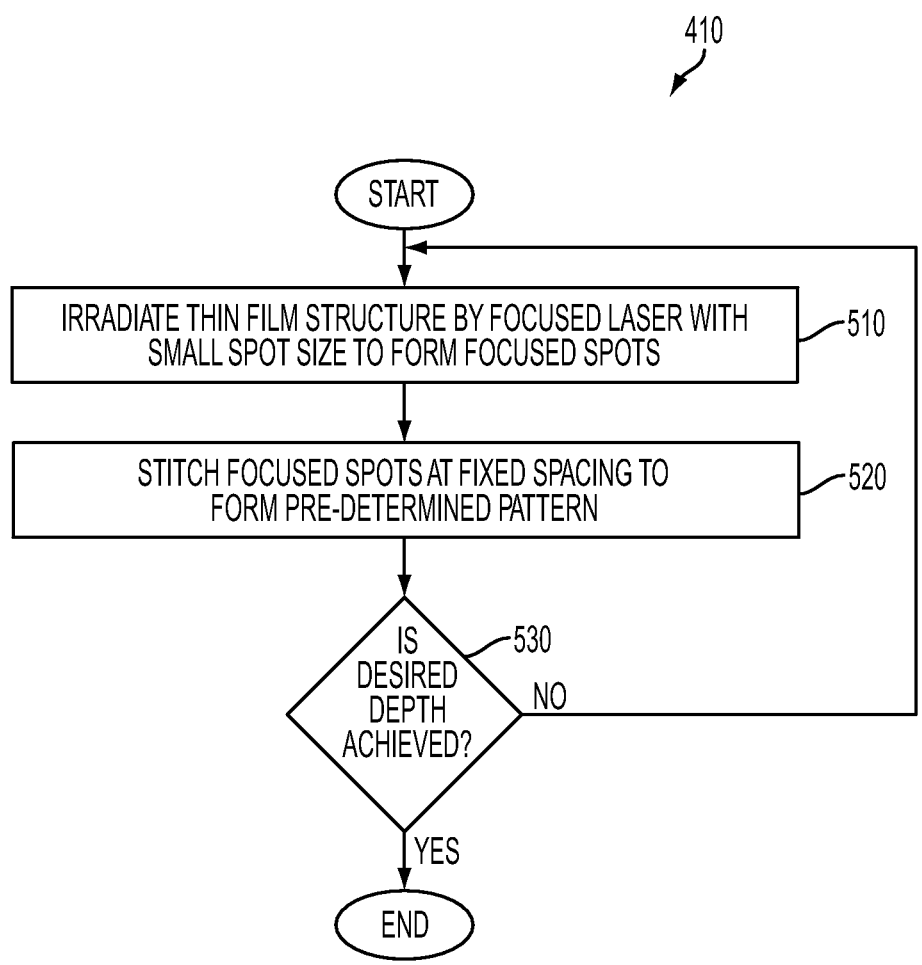
FIG. 5 is a flowchart illustrating a process to selectively decompose regions of the thin film structure according to one embodiment.

FIG. 5 is a flowchart illustrating the process 410 shown in FIG. 4 to selectively decompose regions of the thin film structure according to one embodiment.

Upon START, the process 410 irradiates the thin film structure by a focused laser with a small spot size to form focused spots (Block 510). In one embodiment, the spot size is approximately 10×20 μm.

Then, the process 410 stitches the focused spots at a fixed spacing to form the pre-determined pattern (Block 520). Next, the process 410 determines if the desired depth has been achieved (Block 530). If not, the process 410 returns to Block 510 to repeat the irradiation. Otherwise, if the desired penetration depth has been achieved, the process 410 is terminated. In one embodiment, the focused spots have a depth of approximately 0.2 μm to 1.2 μm.

Figure 6:
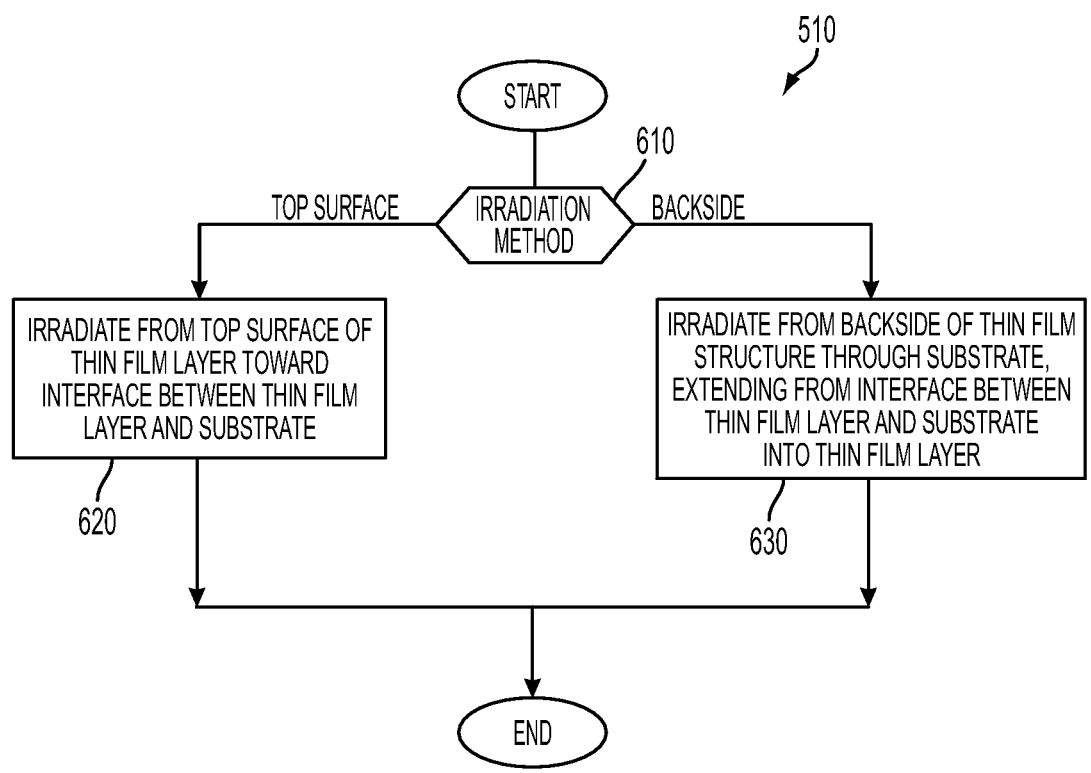
FIG. 6 is a flowchart illustrating a process to irradiate the thin film structure according to one embodiment.

FIG. 6 is a flowchart illustrating the process 510 shown in FIG. 5 to irradiate the thin film structure according to one embodiment. There are at least two methods to irradiate the thin film structure.

Upon START, the process 510 determines the irradiation method (Block 610). If the irradiation method is a top surface method, the process 510 irradiates from top surface of the thin film layer toward the interface between the thin film layer and the substrate (Block 620). The top surface corresponds to the thin film layer. The process 510 is then terminated.

If the irradiation method is a backside method, the process 510 irradiates from backside of the thin film structure through the substrate and extending from the interface between the thin film-layer and the substrate into the thin film layer (Block 630) and is then terminated.

These methods described for thin film structures may be applied to epitaxial LED structures and a variety of thin film semiconductor structures and devices. This may include epitaxially grown laser structures, and electronic devices such as transistors. Many structures and devices made from nitride semiconductors employ similar growth and processing methods making application of the methods described here both feasible and helpful.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus comprising:
a thin film layer of a thin film structure, the thin film layer having flaws formed in a pre-determined pattern, the flaws locally concentrating stress in the pre-determined pattern during a stress-inducing operation to fracture the thin film layer at the pre-determined pattern during the stress-inducing operation, wherein the thin film layer has a thickness and each of the flaws have a depth, wherein the thickness of the thin film layer is greater than the depth of the flaws, and wherein the predetermined pattern is configured to maintain the thickness of the thin film layer when the thin film layer is fractured in the stress-inducting operation; and
a substrate attached to the thin film layer, wherein the substrate is removed in the stress-inducing operation.

2. The apparatus of claim 1 wherein the flaws comprise focused spots with a small spot size, the focused spots being stitched to form a decomposable region in the pre-determined pattern.

3. The apparatus of claim 2 wherein the decomposable region is near diced edges of the thin film structure.

4. The apparatus of claim 2 wherein at least one of the flaws is a trench, a notch, or a void formation.

5. The apparatus of claim 2 wherein the thin film layer is an alloy containing nitride.

6. The apparatus of claim 5 wherein the alloy is one of Gallium Nitride (GaN), Aluminum Gallium Nitride (AlGaN), Indium Gallium Nitride (InGaN), and Aluminum Indium Gallium Nitride (AlInGaN).

7. The apparatus of claim 1 wherein the thin film structure is one of a light emitting diode (LED) structure, a transistor structure, and a laser structure.

8. The apparatus of claim 7 wherein the thin film layer is an epitaxially grown LED, transistor, or laser layer.

9. The apparatus of claim 1 wherein the flaws extend from top surface of the thin film layer toward interface between the thin film layer and the substrate when the stress-inducing process starts from a top surface of the thin film layer towards an interface between the thin film layer and the substrate.

10. The apparatus of claim 1 wherein the flaws extend from interface between the thin film layer and the substrate into the thin film layer when the stress-inducing process starts from the substrate towards the interface.

11. The apparatus of claim 1 wherein the substrate is a sapphire substrate.

12. The apparatus of claim 1 wherein the substrate includes an intermediate layer grown separately from the thin film layer.

13. The apparatus of claim 12 wherein the intermediate layer is an alloy being one of Gallium Nitride (GaN), Aluminum Nitride (AlN), Aluminum Gallium Nitride (AlGaN), Indium Gallium Nitride (InGaN), and Aluminum Iridium Gallium Nitride (AlInGaN).

* * * * *